United States Patent
Sengupta et al.

(10) Patent No.: US 11,560,304 B2
(45) Date of Patent: Jan. 24, 2023

(54) SURFACE BIO-FUNCTIONALIZATION METHOD

(71) Applicants: CENTRE NATIONAL DE LA RECHERCHE SCIENTIFIQUE, Paris (FR); UNIVERSITÉ D'AIX-MARSEILLE, Marseilles (FR)

(72) Inventors: Kheya Sengupta, Marseilles (FR); Emmanuelle Benard, Marseilles (FR); Igor Ozerov, Marseilles (FR); Frédéric Bedu, Marseilles (FR); Hervé Dallaporta, Marseilles (FR)

(73) Assignees: CENTRE NATIONAL DE LA RECHERCHE SCIENTIFIQUE, Paris (FR); UNIVERSITÉ D'AIX-MARSEILLE, Marseilles (FR)

( * ) Notice: Subject to any disclaimer, the term of this patent is extended or adjusted under 35 U.S.C. 154(b) by 0 days.

(21) Appl. No.: 17/044,475

(22) PCT Filed: Apr. 17, 2019

(86) PCT No.: PCT/FR2019/050915
§ 371 (c)(1),
(2) Date: Oct. 1, 2020

(87) PCT Pub. No.: WO2019/202260
PCT Pub. Date: Oct. 24, 2019

(65) Prior Publication Data
US 2021/0053822 A1    Feb. 25, 2021

(30) Foreign Application Priority Data
Apr. 18, 2018  (FR) .................................... 1853414

(51) Int. Cl.
  *B81C 1/00*      (2006.01)
  *B82Y 20/00*    (2011.01)
  *B82Y 30/00*    (2011.01)

(52) U.S. Cl.
  CPC ...... *B81C 1/00206* (2013.01); *B81C 1/00214* (2013.01); *B82Y 20/00* (2013.01); *B82Y 30/00* (2013.01); *B81B 2201/0214* (2013.01)

(58) Field of Classification Search
  CPC ............................................... B81C 1/00206
  See application file for complete search history.

(56) References Cited

U.S. PATENT DOCUMENTS 5,677,109 A * 10/1997 Morikawa .............. B82Y 10/00
                                                         430/296
6,194,157 B1 * 2/2001 Tsuchiya ................. C07K 1/24
                                                         435/6.11
9,180,519 B2    11/2015 Jung et al.
2005/0046758 A1  3/2005 Matsushita et al.
2013/0294972 A1* 11/2013 Kinz-Thompson ....... G01N 33/5306
                                                         422/69
2015/0042702 A1*  2/2015 Jiang .................... B42D 25/328
                                                         345/694

FOREIGN PATENT DOCUMENTS

WO    2013/013831 A1    1/2013
WO    2014/052759 A1    4/2014

OTHER PUBLICATIONS

A. Nassereddine et al., Ligand Nanocluster Array Enables Artificial-Intelligence-Based Detection of Hidden Features in T-Cell Architecture, 21 Nano Lett. 5606-5613 (2021).*
International Search Report for International Application No. PCT/FR2019/050915, dated Nov. 5, 2019, 8 pages (with English translation).
International Written Opinion for International Application No. PCT/FR2019/050915, dated Nov. 5, 2019, 8 pages (with English machine translation).
Benard et al, "Ligand Nano-cluster Arrays in a Supported Lipid Bilayer", Journal of Visualized Experiments: JoVE, DOI: 10.3791/55060> external link Apr. 23, 2017 (Apr. 23, 2017), Retrouvé de : URL:https://hal-amu.archives-ouvertes.fr/hal-01577346/document XP055531684.
Pi et al., "Nanometric Protein-Patch Arrays on Glass and Polydimethylsiloxane for Cell Adhesion Studies," Nano Letters, American Chemical Society, (2013), vol. 13, No. 7, pp. 3372-3378.
Tomescu et al, "Technological studies for plasmonic metasurfaces", Proceedings of SPIE; [Proceedings of SPIE ISSN 0277-786X vol. 10524], SPIE, US,vol. 10010,Dec. 14, 2016 (Dec. 14, 2016), p. 100101U-1-100101U-6, XP060079206 DOI: 10.1117/12.2243293.

* cited by examiner

*Primary Examiner* — Randy Boyer
(74) *Attorney, Agent, or Firm* — TraskBritt

(57) ABSTRACT

A method for functionalizing a surface of a dielectric plate that is transparent to visible light—to be able to examine the dielectric plate using optical microscopy—includes depositing a negative film on the dielectric slide. The negative film comprises a polymerizable composition that polymerizes when exposed to an electron beam. The polymerizable composition is polymerized—by exposing the negative film to the electronic beam—at a set of points representing a preset pattern. Non-polymerized portions of the polymerizable composition are dissolved—to develop the negative film—forming a set of pads of polymerized portions of the polymerizable composition. Each pad corresponds to one point of the preset pattern. A metal film is disposed on the negative film, and the developed negative film is dissolved to define holes through the metal film. Each of the holes corresponds to a base of one pad of the set of pads.

9 Claims, 3 Drawing Sheets

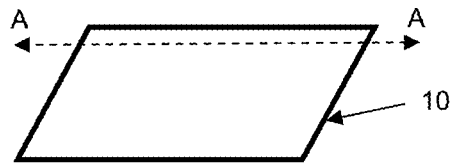 
FIGURE 1A  FIGURE 1B
 
FIGURE 2A  FIGURE 2B
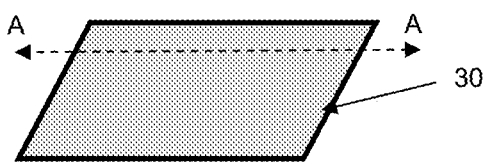 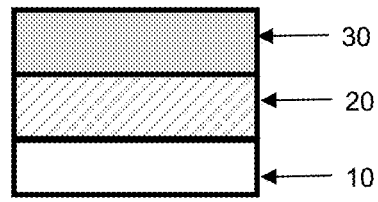
FIGURE 3A  FIGURE 3B
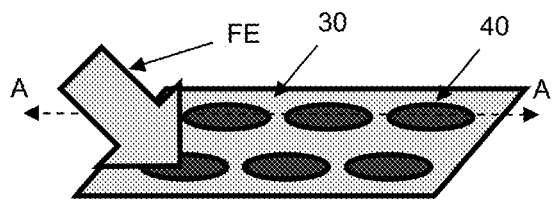 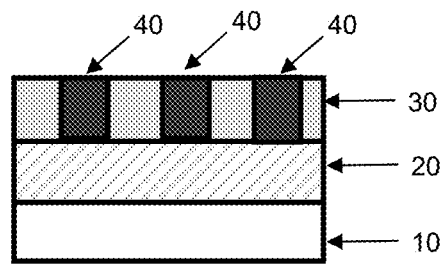
FIGURE 4A  FIGURE 4B
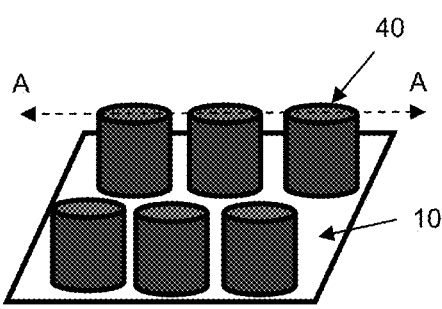 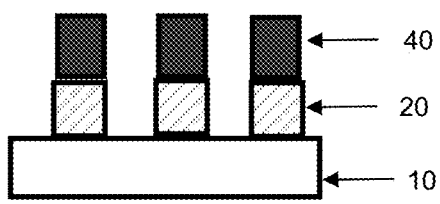
FIGURE 5A  FIGURE 5B

SURFACE BIO-FUNCTIONALIZATION METHOD

CROSS-REFERENCE TO RELATED APPLICATIONS

This application is a national phase entry under 35 U.S.C. § 371 of International Patent Application PCT/FR2019/050915, filed Apr. 17, 2019, designating the United States of America and published as International Patent Publication WO 2019/202260 A2 on Oct. 24, 2019, which claims the benefit under Article 8 of the Patent Cooperation Treaty to French Patent Application Serial No. 1853414, filed Apr. 18, 2018.

TECHNICAL FIELD

The present disclosure relates to the field of bio-functionalization of surfaces by nanolithography, for applications in biology, chemistry and more generally biochemistry, involving optical microscopy of the surface.

BACKGROUND

In the field of nanolithography, document EP2736635, which aims to produce patterns of metal nanoparticles on a substrate, is, for example, known. Typically, the metal nanoparticles are made of gold and the substrate is an inorganic oxide of high optical refractive index (for example, $TiO_2$, ZnO, etc.).

Document U.S. Pat. No. 9,180,519, which describes a process for fabricating nanostructures distributed in a preset pattern with a view to adhering a target thereto, whether this be for optical or biological devices, is also known. The nanostructures are typically gold nanopads.

Other documents are known, for example, US20050046758 and WO2014052759 or even the publication "Nanometric protein-patch arrays on glass and polydimethylsiloxane for cell adhesion studies," F. Pi et al., Nano Lett. 2013, 13, 3372-3378. However, all these documents make provision to produce metal and, in particular, gold nanostructures (also called nanopads, nanoislands or nanoparticles) allowing the adhesion of proteins.

However, the presence of such metal nanostructures causes problems for optical microscopy, for example, via non-linear optical effects.

The present disclosure allows this problem to be solved.

BRIEF SUMMARY

More precisely, the present disclosure relates to a method for treating a surface of a dielectric slide that is transparent to visible light, with a view to observation of the dielectric slide by optical microscopy.

It comprises the following steps:
 depositing, on the slide, a negative film comprising a polymerizable composition that polymerizes when it is exposed to an electron beam,
 polymerizing the composition of the negative film at a set of points representing a preset pattern, by exposing the negative film to an electron beam,
 developing the negative film by dissolving the non-polymerized composition and obtaining a set of pads of polymerized composition, each pad corresponding to one point of the preset pattern,
 depositing a metal film on the negative film of the surface of the slide, and
 dissolving the developed negative film, in order to obtain a metal film pierced with holes, each hole of the metal film corresponding to the base of one pad.

Provision may also be made for a step comprising:
 functionalizing the surface of the dielectric slide by depositing a monolayer of proteins in the holes of the metal film, in order to produce a set of islands of proteins, each island being placed in a respective hole of the metal film.

Provision may furthermore be made, prior to the functionalizing step, for a step comprising:
 depositing an adhesion primer in the holes of the metal film.

Provision may also be made for a step comprising:
 dissolving the metal film.

Provision may also be made for a step comprising:
 passivating the surface of the slide with a passivation layer between the islands of proteins.

Provision may also be made for a step comprising:
 bringing the passivated surface of the slide and a first set of at least one functional protein capable of reacting with the proteins of the islands into contact.

Provision may also be made for a step comprising:
 functionalizing the passivation layer with a second set of at least one functional protein, the proteins of the second set being different from the proteins of the first set.

Provision may also be made for a step comprising:
 depositing an adhesion promoter on the surface of the slide prior to the deposition of the negative film.

Provision may be made for the exposure of the negative film to an electron beam to be carried out at a preset constant temperature.

Provision may be made for the step of depositing the metal film on the surface of the slide to be carried out by evaporation or by sputtering, the thickness of the metal film being smaller than that of the negative film.

By virtue of the present disclosure, the islands of proteins are arranged in a preset pattern the total area of which may be from a few square microns up to 1 $mm^2$ or 2 $mm^2$.

Each island of proteins may have an equivalent diameter as small as 50 nm. The islands may be arranged in an array the pitch of which is as small as 100 nm. Thus, when a biological cell is placed on a carrier slide, it makes contact with a plurality of islands of proteins.

Other features and advantages of the present disclosure will become more clearly apparent on reading the following description, which is given by way of illustrative and non-limiting example, with reference to the appended figures.

BRIEF DESCRIPTION OF THE DRAWINGS

FIG. 1A illustrates a dielectric slide that is transparent to visible light,

FIG. 1B illustrates a cross section cut along the axis A-A of FIG. 1A,

FIG. 2A illustrates the slide of FIG. 1A after a layer of adhesion promoter has been deposited, FIG. 2B illustrates a cross section cut along the axis A-A of FIG. 2A, FIG. 3A illustrates the slide of FIG. 2A after a negative film has been deposited, FIG. 3B illustrates a cross section cut along the axis A-A of FIG. 3A, FIG. 4A illustrates the slide of FIG. 3A after exposure to an electron beam, FIG. 4B illustrates a cross section cut along the axis A-A of FIG. 4A, FIG. 5A illustrates the slide of FIG. 4A after the negative film has been developed, FIG. 5B illustrates a cross section cut along the axis A-A of FIG. 5A.

DETAILED DESCRIPTION

Figure 6A:
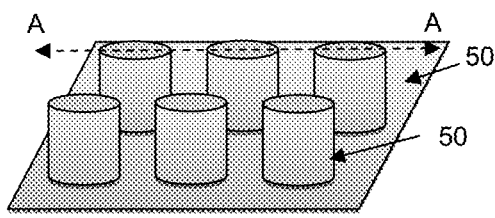
FIG. 6A illustrates the slide of FIG. 5A after a metal film has been deposited.

Embodiments of the present disclosure comprise treating a surface of a dielectric slide 10 that is transparent to visible light, with a view to the observation by optical microscopy of the dielectric slide 10, which in the present embodiment is a glass slide (FIG. 1B) that is referred to as the "slide" below for the sake of conciseness.

For the sake of conciseness, the dielectric slide 10 that is transparent to visible light, which serves as a carrier, is referred to simply as the "slide" (e.g., slide 10) below.

Provision may optionally be made to uniformly deposit a layer of adhesion promoter 20 on the surface of the slide 10 (FIG. 2B).

Next, provision is made to deposit, on the slide 10, a negative film 30 comprising a polymerizable composition that polymerizes when it is exposed to an electron beam (FIG. 3B), for example a composition comprising an organic solvent, polymer chains in solution and molecules of binding agent, and the catalyst that promotes the polymerization reaction, or even the film of AR-N 7520-18 from the company ALLRESIST. Preferably, the negative film 30 is deposited on the surface of the slide 10 so as to have a uniform thickness, for example by spin-coating.

Preferably, the exposure of the negative film 30 to an electron beam is carried out at a preset constant temperature.

The negative film 30 may then be exposed to an electron beam FE (FIG. 4A) at a set of points, in order to draw a preset pattern, typically an array pattern.

Each point of contact between the electron beam FE and the negative film 30 allows the composition of the negative film 30 to be polymerized plumb with the point of contact, this creating a cylinder or pad 40 of polymerized composition. For example, the composition is a resist.

Once the preset pattern has been fully drawn, provision is made to develop the negative film 30 in order to dissolve the unpolymerized composition, for example, via immersion in a solvent.

A set of polymerized-resist pads is thus obtained, each pad corresponding to one point of the preset pattern (FIG. 5A).

Provision may then be made to deposit a metal film (or layer) 50 on the negative film of the surface of the slide (FIG. 6A), this forming a mask that serves as template for the islands 70 of proteins described below.

In the present embodiment, the deposition is carried out by evaporation or sputtering. In the present embodiment, the metal is aluminum.

Figure 6B:
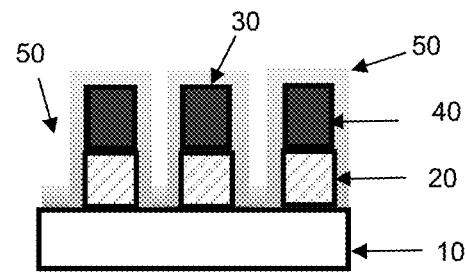
FIG. 6B illustrates a cross section cut along the axis A-A of FIG. 6A.

Preferably, the thickness of the metal film 50 is smaller than that of the negative film 30. In other words, the height of the pads 40 is larger than the thickness of the metal film 50 (FIG. 6B).

Provision may be made for the ratio between the thickness of the metal film and the thickness of the negative film 30 to be higher than a threshold value.

Figure 7A:
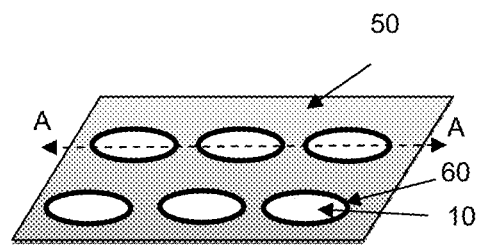
FIG. 7A illustrates the slide of FIG. 6A after the negative film has been dissolved.
Figure 7B:
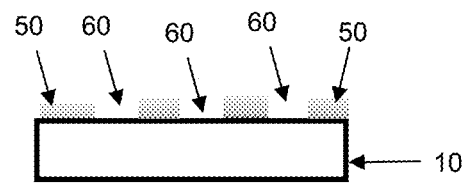
FIG. 7B illustrates a cross section cut along the axis A-A of FIG. 7A.

The resist film 30 may then be dissolved. In the present embodiment, the dissolution is achieved by dipping in a bath of organic solvent suitable for the polymerizable composition. The dissolution of the resist film 30, i.e., of the pads 40, leads to the lift off of the metal film 50 on the pads 40 but not of the metal film 50 between the pads 40. Thus, after dissolution, the metal film 50 on the exterior surface of the slide 10 contains holes 60 where the pads 40 used to be and has a constant thickness elsewhere (FIG. 7B).

Each hole 60 therefore corresponds to the base of one pad 40.

At this stage, the slide 10 may be stored for several months.

Figure 8A:
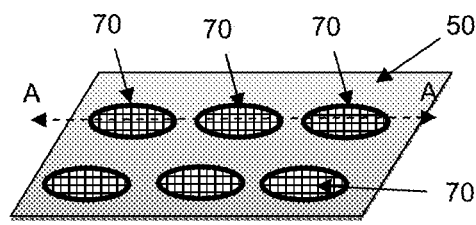
FIG. 8A illustrates the slide of FIG. 7A after functionalization.
Figure 8B:
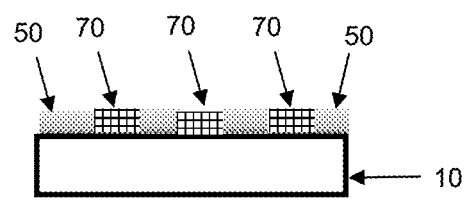
FIG. 8B illustrates a cross section cut along the axis A-A of FIG. 8A.

Provision is then made to functionalize the surface of the slide 10 by depositing a layer, a monolayer for example, of functional proteins, for example by incubation in a protein bath, in the holes 60 of the metal film, so as to produce a set of islands 70 of proteins, each island 70 of proteins being placed in a respective hole 60 of the metal film 50 (FIG. 8B); the functionalization typically comprising a rinsing step.

In the present embodiment, the monolayer of proteins is a monolayer of bovine serum albumin marked with a label, in the present embodiment biotin (vitamin H).

To this end, provision is preferably made to deposit an adhesion primer (not illustrated) in the holes 60 of the metal film 50 prior to the deposition of a monolayer of proteins, for example by evaporation or by submerging the slide 10 in an aqueous solution.

The adhesion primer is, for example, a molecule, in the present embodiment an aminosilane molecule, that not only allows covalent bonds to be made with the glass of the slide 10 but also allows the adhesion of preset proteins.

Each island 70 of proteins may have an equivalent diameter as small as 50 nm. Depending on the preset pattern chosen, the islands 70 of proteins may be arranged in an array the pitch of which is as small as 100 nm.

Thus, when a biological cell is placed on a carrier slide functionalized according to the present disclosure, it may make contact with a plurality of islands 70 of proteins.

A biological cell in contact with a functionalized slide according to the present disclosure reacts differently not only depending on the pattern (and notably on the equivalent diameter of the islands 70, the density of the islands 70 and the pitch of the array) but also depending on the nature of the proteins of the islands 70. Thus, preferably, all of the islands 70 of proteins comprise the same proteins.

Figure 9A:
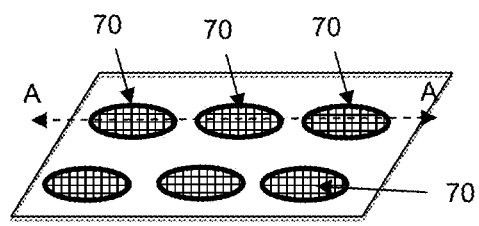
FIG. 9A illustrates the slide of FIG. 8A after the metal film has been dissolved.
Figure 9B:
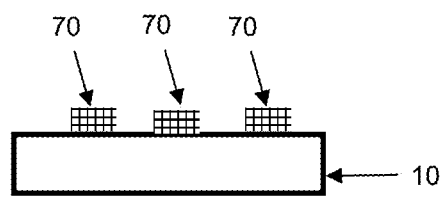
FIG. 9B illustrates a cross section cut along the axis A-A of FIG. 9A.

Provision may then be made to dissolve the metal film 50 (FIG. 9A, FIG. 9B), in the present embodiment in a soda bath. The advantage of aluminum is that it is dissolved by soda whereas the proteins of the islands 70 of proteins are not attacked by soda.

Thus, following the dissolution of the metal film 50, all that remains on the surface of the slide 10 are nanopads of proteins, i.e., the proteins of the islands 70 of proteins, adhering to the surface of the slide 10 directly or via the adhesion promoter 20, i.e., the metal nanostructures that would otherwise interfere with the light of an optical microscope have been removed.

Thus, contrary to the references cited at the start of the description, by virtue of the present disclosure, no metal nanopads remain between the islands 70 of proteins and the surface of the slide 10.

At this stage, the slide 10 may be stored for several days.

Figure 10A:
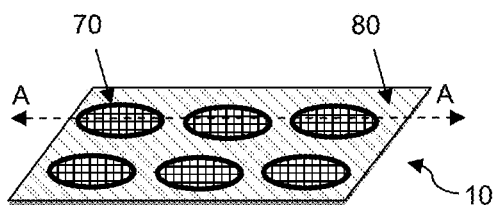
FIG. 10A illustrates the slide of FIG. 9A after passivation.
Figure 10B:
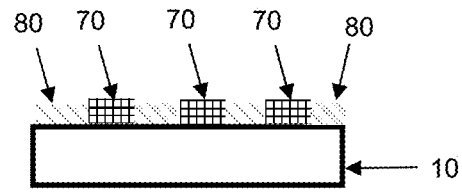
FIG. 10B illustrates a cross section cut along the axis A-A of FIG. 10A.

Provision may also be made to passivate the surface of the slide 10 between the islands 70 of proteins with a passivation layer 80 (FIG. 10A, FIG. 10B), for example with an organic layer, a polymer layer, a lipid layer (in the present embodiment a lipid bilayer) or a layer of another protein. The passivation may, for example, be achieved by deposition or bathing and adsorption of a passivation layer that is inert with respect to the marked proteins, this making it possible to guarantee that the active proteins of the functionalization step below bind only with the marked proteins of the islands 70.

Figure 11A:
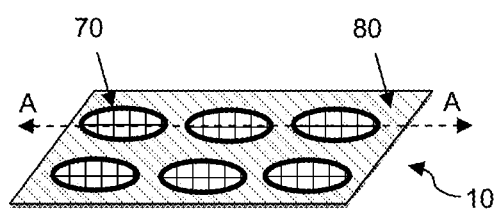
FIG. 11A illustrates the slide of FIG. 10A after functionalization.
Figure 11B:
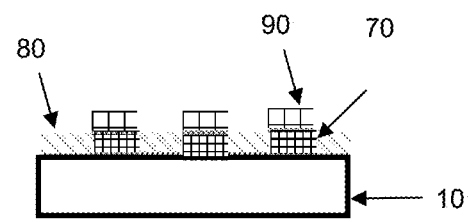
FIG. 11B illustrates a cross section cut along the axis A-A of FIG. 11A.

The functionalization of the surface of the slide 10 may then be finalized by bringing the surface of the slide 10, which is optionally passivated, into contact with a first set of at least one functional protein 90, antibodies for example, capable of reacting with the proteins of the islands 70 of proteins (FIG. 11A, FIG. 11B), optionally via a binding intermediate protein.

The first set of at least one functional protein 90 allows living biological cells brought into contact with the surface of the slide 10 to be studied, notably by optical microscopy.

A functionalized slide 10 according to embodiments of the present disclosure may take the form of a lab-on-a-chip.

At this stage, the slide 10 may be stored for several hours.

The present disclosure is not limited to the embodiments described above.

Figure 12A:
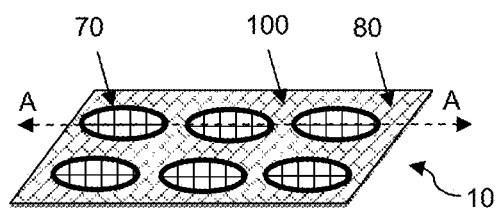
FIG. 12A illustrates the slide of FIG. 11A after the passivation layer has been functionalized.
Figure 12B:
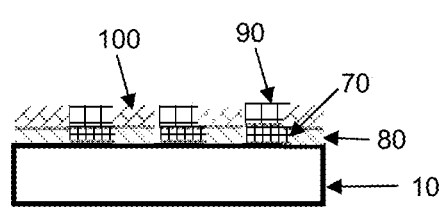
FIG. 12B illustrates a cross section cut along the axis A-A of FIG. 12A.

For example, provision may be made to also functionalize the passivation layer 80 (FIG. 12A, FIG. 12B).

To this end, a second set of at least one functional protein 100 may be provided, the proteins of the second set of at least one functional protein 100 being different from the proteins of the first set of at least one functional protein 90 and preferably not being capable of reacting with the proteins of the islands 70 of proteins.

For example, for immune cells (T cells), provision is made for the first set of at least one functional protein 90 to be a receptor and for the second set of at least one functional protein 100 to be a co-receptor.

By virtue of the present disclosure, a plurality of islands 70 of proteins may be manufactured simultaneously.

NOMENCLATURE

10 dielectric slide that is transparent to visible light
20 adhesion promoter
30 negative film that polymerizes when it is exposed to an electron beam
40 pad of polymerized resist
50 metal film
60 hole in the metal film 50
70 island of proteins
80 passivation layer
90 first set of functional proteins, capable of reacting with the proteins of the islands of proteins 70
100 second set of functional proteins

The invention claimed is:

1. A method for treating a surface of a dielectric slide that is transparent to visible light, with a view to observation of the dielectric slide by optical microscopy, the method comprising:
    depositing, on a dielectric slide that is transparent to visible light, a negative film comprising a polymerizable composition that polymerizes when exposed to an electron beam;
    polymerizing the polymerizable composition of the negative film at a set of points representing a preset pattern, the polymerizing comprising exposing the negative film to the electron beam;
    developing the negative film, comprising dissolving non-polymerized portions of the polymerizable composition to form a set of pads of polymerized portions of the polymerizable composition, each pad corresponding to one point of the preset pattern;
    depositing a metal film on the negative film on the surface of the dielectric slide;
    dissolving the developed negative film to define holes through the metal film, each of the holes defined through the metal film corresponding to a base of one pad of the set of pads;
    functionalizing the surface of the dielectric slide, the functionalizing comprising depositing a monolayer of proteins in the holes defined through the metal film to form a set of islands of the proteins, each island of the set of islands being placed in a respective hole of the holes defined through the metal film; and
    dissolving the metal film to remove substantially all of the metal film.

2. The method of claim 1, further comprising, prior to the functionalizing:
    depositing an adhesion primer in the holes defined through the metal film.

3. The method of claim 1, further comprising:
    passivating the surface of the dielectric slide, the passivating comprising forming a passivation layer between the islands of the set of islands of the proteins.

4. The method of claim 3, further comprising:
    bringing the passivated surface of the dielectric slide into contact with a first set of at least one functional protein capable of reacting with the proteins of the set of islands of the proteins.

5. The method of claim 4, further comprising:
    functionalizing the passivation layer with a second set of at least one functional protein, the at least one functional protein of the second set of at least one functional protein being different from the at least one functional protein of the first set of at least one functional protein.

6. The method of claim 1, further comprising:
    depositing an adhesion promoter on the surface of the dielectric slide prior to depositing the negative film.

7. The method of claim 1, wherein exposing the negative film to the electron beam is carried out at a preset constant temperature.

8. The method of claim 1, wherein:
    depositing the metal film on the negative film on the surface of the dielectric slide comprises evaporating or sputtering the metal film on the negative film on the surface of the dielectric slide, a thickness of the metal film being less than that of the negative film.

9. A method for treating a surface of a dielectric slide that is transparent to visible light, with a view to observation of the dielectric slide by optical microscopy, the method comprising:
  depositing, on a dielectric slide that is transparent to visible light, a negative film comprising a polymerizable composition that polymerizes when exposed to an electron beam;
  polymerizing the polymerizable composition of the negative film at a set of points representing a preset pattern, the polymerizing comprising exposing the negative film to the electron beam,
  developing the negative film, comprising dissolving non-polymerized portions of the polymerizable composition to form a set of pads of polymerized portions of the polymerizable composition, each pad corresponding to one point of the preset pattern;
  depositing a metal film on the negative film on the surface of the dielectric slide;
  dissolving the developed negative film to define holes through the metal film, each of the holes defined through the metal film corresponding to a base of one pad of the set of pads;
  functionalizing the surface of the dielectric slide, the functionalizing comprising depositing a monolayer of proteins in the holes defined through the metal film to form a set of islands of the proteins, each island of the set of islands being placed in a respective hole of the holes defined through the metal film; and
rinsing the functionalized surface of the dielectric slide,
wherein, following the functionalization of the surface of the dielectric slide and the rinsing of the functionalized surface of the dielectric slide, substantially only portions of the surface of the dielectric slide exposed in the holes are functionalized and at least upper surfaces of the metal film are not functionalized.

* * * * *